United States Patent [19]

Matthews

[11] Patent Number: 5,477,166

[45] Date of Patent: Dec. 19, 1995

[54] PROGRAMMABLE OUTPUT DEVICE WITH INTEGRATED CIRCUIT

[75] Inventor: Wallace E. Matthews, Richardson, Tex.

[73] Assignee: Benchmarq Microelectronics, Dallas, Tex.

[21] Appl. No.: 450,220

[22] Filed: May 25, 1995

Related U.S. Application Data

[63] Continuation of Ser. No. 52,134, Apr. 22, 1993, abandoned.

[51] Int. Cl.$^6$ .................................. H03K 19/177
[52] U.S. Cl. .................................. 326/38; 326/83
[58] Field of Search .................. 307/465, 443, 307/475, 451, 445; 326/38, 83, 121

[56] References Cited

U.S. PATENT DOCUMENTS

| | | | |
|---|---|---|---|
| 4,721,868 | 1/1988 | Cornell et al. | 307/465 |
| 4,972,100 | 11/1990 | Lim et al. | 307/443 |
| 4,987,325 | 1/1991 | Seo | 307/465 |
| 4,990,800 | 2/1991 | Lee | 307/465 |
| 4,991,085 | 2/1991 | Pleva et al. | 364/200 |
| 5,027,011 | 6/1991 | Steele | 307/465 |
| 5,030,821 | 7/1991 | Fukuyama | 250/214 |
| 5,051,622 | 9/1991 | Pleva | 307/465 |
| 5,084,635 | 1/1992 | Toda et al. | 307/465 |
| 5,148,048 | 9/1992 | Kawasaki et al. | 307/443 |
| 5,198,707 | 3/1993 | Nicolai | 307/475 |
| 5,216,293 | 6/1993 | Sei et al. | 307/443 |

*Primary Examiner*—Edward P. Westin
*Assistant Examiner*—Benjamin D. Driscoll
*Attorney, Agent, or Firm*—Gregory M. Howison

[57] ABSTRACT

An integrated circuit with programmable output drive/program pins includes a plurality of output pads (30) which are each operable to interface with a separate and dedicated output driver (38). The output driver (38) is operable to drive an LED output device (14) in an operating mode. In a program mode, the driver (38) is disabled and a program buffer (40) enabled. At the same time, the LED output device (14) is disabled such that no impedance is presented to the output pad (30) due to operation of the LED output device (14). A programming resistor (18) is disposed between the pad (30) and one of three program reference voltages. A first program state is represented when the resistor (18) is tied to ground, a second program state is represented when the resistor (18) is tied to an open circuit and a third program state is represented when the resistor (18) is tied to a positive voltage. The program buffer (40) senses the presence of the resistor and what voltage it is tied to by either sinking current to the pad (30) or sourcing current therefrom. Therefore, the resistor (18) can be disposed on the pad (30) during operation and a power on reset or any type of external reset controlling a CPU (46) to initiate the program operation.

14 Claims, 4 Drawing Sheets

| RPU | RPD | Pup Res | Pdn Res | RPC |
|---|---|---|---|---|
| 1 | 0 | X | | 0 |
| 1 | 0 | | X | 1 |
| 1 | 0 | | | 0 |
| 0 | 1 | X | | 0 |
| 0 | 1 | | X | 1 |
| 0 | 1 | | | 1 |

FIG. 6

PROGRAMMABLE OUTPUT DEVICE WITH INTEGRATED CIRCUIT

This application is a continuation of application Ser. No. 08/052,134, filed Apr. 22, 1993, now abandoned.

TECHNICAL FIELD OF THE INVENTION

The present invention pertains in general to multiplexing the function of the output pins on an integrated circuit and, more particularly, to utilizing the output pins of an integrated circuit to both drive an external device and also receive programming inputs thereon.

BACKGROUND OF THE INVENTION

Due to the increasing density of integrated circuits and the increasing number of functions that are integrated into the integrated circuit, each pin associated with a packaged device is utilized to serve multiple functions. For example, some integrated circuits are operated in a test mode or in an operating mode. In the test mode, the operating mode is disabled and signals input thereto are then recognized as being test signals. Typically, one pin is dedicated to selecting the test mode or the operating mode. Thereafter, input pins can typically serve two different input functions. When the pins are used in programming applications with three-state inputs, typically small impedances are utilized. For example, the pin is allowed to float or be connected directly to the positive or negative rail.

Although output driver pins have been utilized for input/output functions, these functions are typically separate operations, i.e., the output device is driven by the pin, and an output function is typically not present when an input signal is applied thereto. This is due to the fact that the impedance presented to the pin by the output device interferes with the input function. Further, the input function typically also requires a low impedance. For example, if an input required a low logic state signal to be applied thereto, the signal could not be applied thereto while the active device was attached, as this may cause excessive current to flow through the active device and may, in fact, turn the active device on if it were some device such as a display element.

SUMMARY OF THE INVENTION

The present invention disclosed and claimed herein comprises a method and apparatus for programming an integrated circuit through an output pin, which output pin operates in a programming mode and in an operating mode. In the operating mode, the output pin has associated therewith a driver for driving the output pin. In the program mode, an output programming device is provided for selectively disposing a programming impedance between the output pin and an external voltage reference or disposing no programming impedance between the output pin and any reference voltage. The presence of a programming impedance indicates a first program state and the presence of no programming impedance indicates a second program state. A program buffer is provided for determining in a program mode whether the programming impedance is present, indicating the presence of the first program state, or whether no programming impedance is present, indicating whether the second program state is present. A controller is operable to read the first and second program states and select the program mode or the operating mode.

In another aspect of the present invention, there are three program states provided. The first and second program states are provided by disposing a separate programming impedance between either an external positive voltage and the output pin or a negative voltage and the output pin. The third program state is present when no programming impedance is disposed between the output pin and any external reference voltage. The program buffer is operable to determine which of the programming impedances is present or if no programming impedance is present, the first, second and third program states determined by the controller. The presence of the programming impedance is determined by either sinking current to the output pin or sourcing current therefrom. During the sourcing step, the voltage on the output pin is measured and, if it falls, this indicates the presence of the programming impedance disposed between the output pin and the negative voltage. If no programming impedance is present or if a programming impedance is connected between the external pin and a positive voltage, the voltage will rise.

In the step of sinking current from the output pin, the voltage is sensed and, as the voltage rises, this indicates that the programming impedance is connected to the external positive reference voltage. If the voltage falls, either the programming impedance is connected to the negative reference voltage or no programming impedance is present. By monitoring the voltages during both the current sourcing operation and the current sinking operation, one of the program states can be determined.

In a further aspect of the present invention, the output device is disabled during the program mode to insure that no programming impedance is presented to the output pin by the output device. The output device is operable to have current sunk therefrom by the driver during the operating mode and, during the program mode, the driver is disabled and the output device is isolated from a voltage supply such that it presents a high impedance to the output pin.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
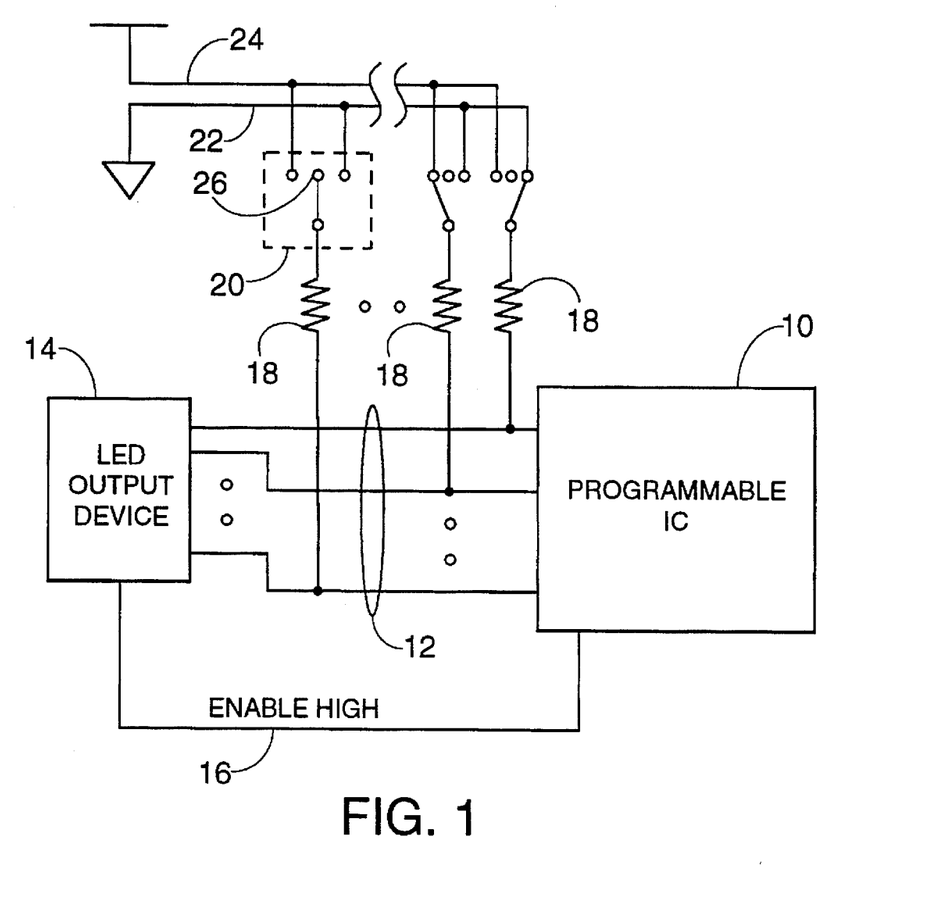
FIG. 1 illustrates an overall block diagram of the integrated circuit and associated output driven devices, with the programming resistors attached to the output drive/program pins.

Referring now to FIG. 1, there is illustrated an overall block diagram of an integrated circuit 10 utilizing the programmable output pins in accordance with one aspect of the present invention. The programmable IC 10 has a plurality of output lines 12 associated with a separate group of output drive/program pins. In the illustrated example of FIG. 1, the output driver lines 12 are input to an LED output device 14, which output device 14 is an LED display. The LED output device 14 has an Enable High line 16 connected thereto which is output from one pin of the programmable IC 10.

Each of the output lines 12 is operable to have a programming resistor 18 associated therewith. Each of the resistors 18 is connected to a switch 20. The switch 20 is operable to be connected to one of three states, either to a ground line 22, a $V_{cc}$ line 24 or a floating node 26. Although the switch 20 is illustrated, it should be understood that, in the preferred embodiment, the resistor is either tied to ground, tied to $V_{cc}$ or left out of the circuit. Therefore, a resistor will be disposed on the output line that will either be a pull up resistor, a pull down resistor, or no resistor. The resistor 18 has a value of approximately 500 KOhms. By placing the resistors 18 on the appropriate one of the lines 12, the line can be programmed with three separate states, high, low and floating.

Figure 2:
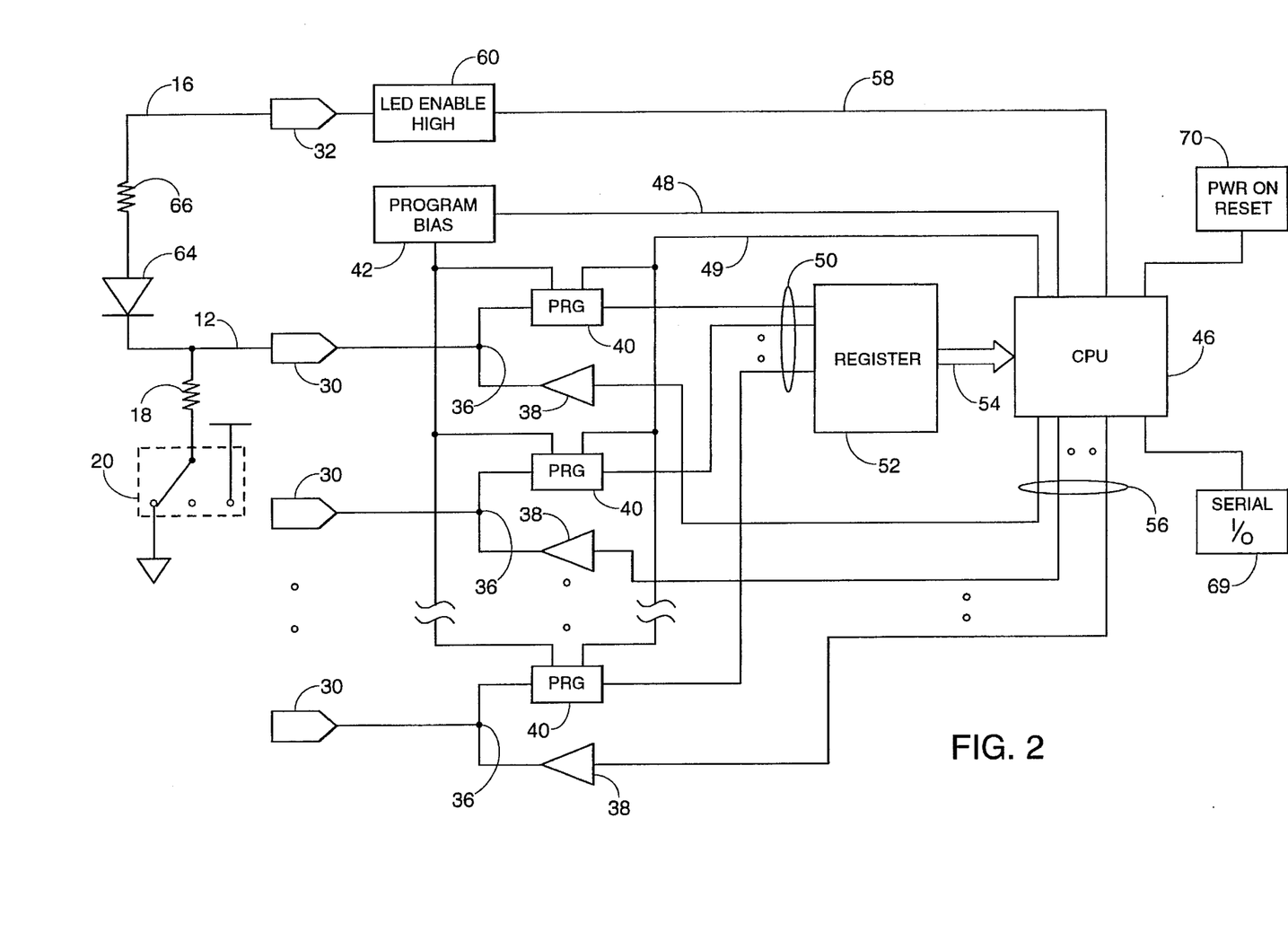
FIG. 2 illustrates a detail of a logic diagram for the programmable output drive/program pins.

Referring now to FIG. 2, there is illustrated a detailed block diagram of the driver portion of the programmable IC 10. A plurality of output drive/program pads 30 are provided, one associated with each of the driver lines 12. Additionally, an enable pin 32 is provided which is connected to the Enable High line 16. Each of the output drive/program pads 30 is connected to a node 36. Each of the nodes 36 is operable to be connected to the output of a pad driver 38 or to the input of a program buffer 40. Each of the program buffers 40 is controlled by a program bias circuit 42, which program bias circuit 42 is operable to turn on each of the program buffers 40 and also receive control signals from a central processing unit (CPU) 46 through control lines 48. The CPU is also operable to input control lines on a line 49 to each of the program buffers 40. The outputs of each of the program .! buffers 40 are connected to one of a group of lines 50, which lines 50 are input to the register 52. Therefore, the outputs of the program buffers 40 are latched into a register 52, which can be read by the CPU 46 through a bus 54. The register 52 in effect appears as a dual port RAM. The CPU 46 is also operable to output the control signals to activate and control the drivers 38. The control signals are input on input lines 56 to the inputs of the drivers 38.

The CPU 46 is also operable to output a disable signal on a line 58, which is input to the enable circuit 60. The enable circuit 60 is operable to enable the external LED output device 14 on the line 16. When the system is operating in normal mode, and the output device 14 is driven, the line 16 is held high. When the program function is utilized and the program states on the drive/program pads 30 are sensed, the line 16 is held low.

FIG. 2 also illustrates one segment of the LED output device 14 comprised of an LED 64 having the cathode thereof connected to one of the output lines 12 associated with one of the pads 30, and the anode thereof connected to one side of the resistor 66. The other side of the resistor 66 is connected to the enable high line 16.

In operation, the system will either operate to drive the LED segments by pulling the pads 30 low with the driver 38, or the drivers 38 will be disabled and the program bias circuit 42 enabled to determine whether there is a pull up resistor, a pull down resistor or a floating input on each of the associated pads 30. The CPU controls this operation to load the value in the register 52. Thereafter, the CPU 46 can read the state of the register. It should be noted that the resistors 18 are always present in either a pull up or a pull down configuration. Since a pull down configuration must be sensed, no current can be supplied thereto through the LED 64 and, therefore, the line 16 must be high impedance. Although some current is drawn, this is minimal. Typically, the CPU 46 reads the program state upon receiving a power on reset signal or any type of user supplied reset signal through a serial input 69. A Power On Reset Circuit 70 is provided for prompting the CPU 46 to read the contents of the register 52 upon initialization and also control the program bias circuit 42 in order to effect proper loading of the program information into the register 52. However, the CPU 46 can read the output of any of the program buffers 40 whenever the input of the driver 38 is not enabled or, conversely, whenever the associated LED segment is not driven. Although the preferred embodiment illustrates a common program bias circuit 42, it should be understood that a separate program bias circuit could be utilized for each of the program buffers 40 and a separate enable high line 16 could be associated with each of the LED segments, although this would significantly increase the pin number.

Figures 3, 4:
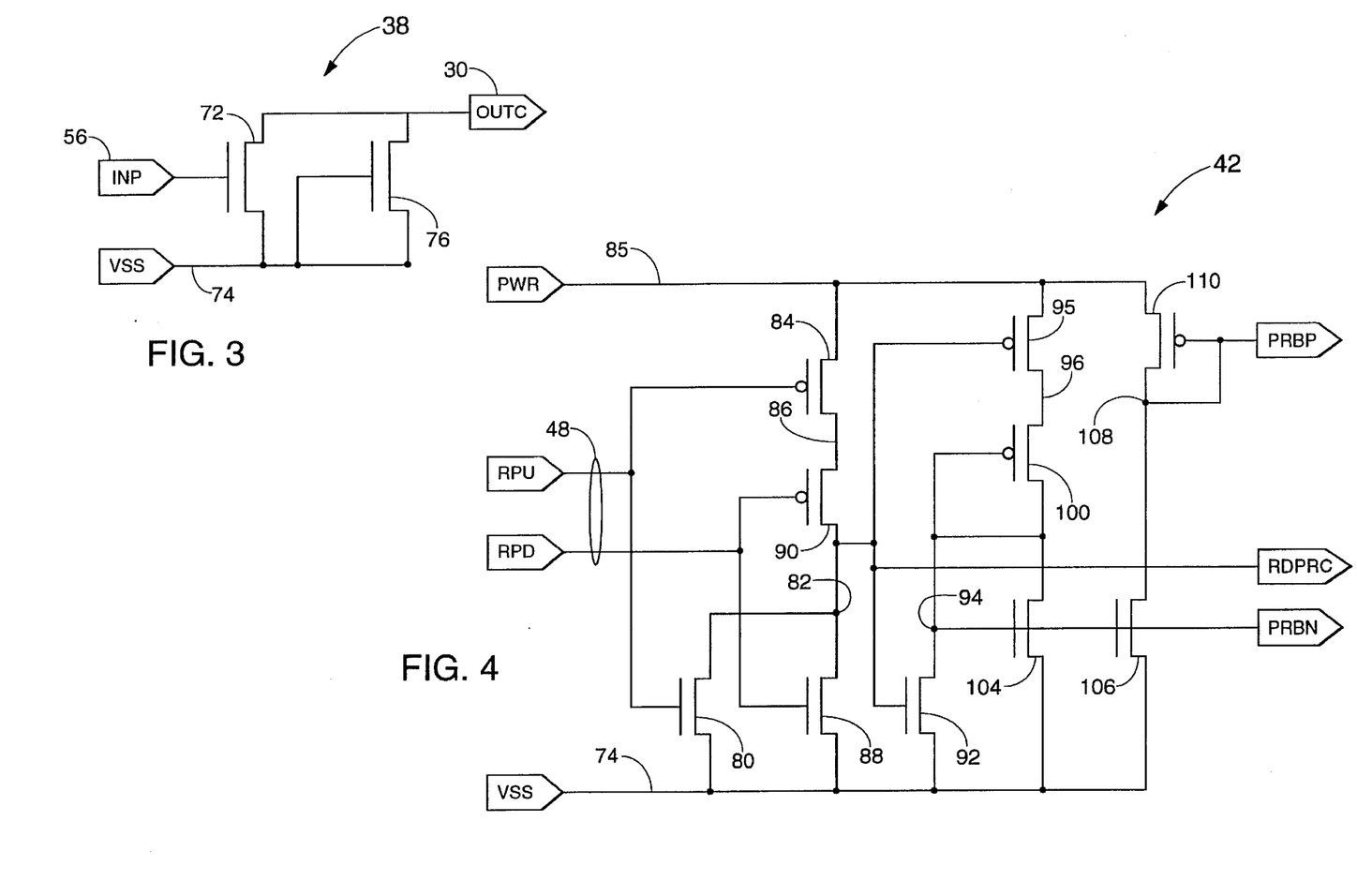
FIG. 3 illustrates a detailed schematic of the output driver.
FIG. 4 illustrates a detailed schematic diagram of the bias circuit for the program buffer.

Referring now to FIG. 3, there is illustrated a logic diagram for the driver 38. The driver 38 is comprised of an N-channel transistor 72, having the source/drain path thereof connected between the output pad 30 and a $V_{ss}$ line 74. The gate thereof is connected to one of the lines 56. A second N-channel transistor 76 has the source/drain path thereof connected between the output pad 30 and the $V_{ss}$ line 74, and the gate thereof connected to the $V_{ss}$ line 74. The transistor 76 is biased to an off state in this manner. This is a conventional configuration for a driver. It should be understood that any type of driver that allows the output pad to be pulled low and current to be sunk from the LED 64 will perform the appropriate operation.

Referring now to FIG. 4, there is illustrated a logic diagram for the program bias circuit 42. The control lines 48 are comprised of two control lines, an RPU line and an RPD line. The RPU input is connected to the gate of an N-channel transistor 80, the source/drain path thereof connected between a node 82 and the $V_{ss}$ line 74. The RPU input is also connected to the gate of a P-channel transistor 84, the source/drain path thereof connected between a power line 85 and a node 86. The RPD input is connected to the gate of an N-channel transistor 88, the source/drain path thereof connected between the node 82 and the $V_{ss}$ line 74. The RPD line is also connected to the gate of a P-channel transistor 90, the source/drain path thereof connected between the node 86 and the node 82. The node 82 is labelled RDPRC with the transistors 80, 88, 84 and 90 comprising a NOR gate.

The node 82, which comprises the output of the NOR gate, is connected to the gate of an N-channel transistor 92, the source/drain path thereof connected between a node 94 and the $V_{ss}$ line 74. Node 82 is also connected to the gate of a P-channel transistor 95, the source/drain path thereof connected between the power line 85 and a node 96. The node 94 is connected to the gate of a P-channel transistor 100, the source/drain path thereof connected between the node 96 and the node 94, such that the transistor 100 is connected in a diode configuration.

The node 94 is also connected to the gate of an N-channel transistor 104, the source/drain path thereof connected to the drain of transistor 100 and the $V_{ss}$ rail 74. The node 94 is also connected to the gate of a transistor 106, the source/drain path thereof connected between a node 108 and the $V_{ss}$ rail 74. A P-channel transistor 110 has the source/drain path thereof connected between the power line 85 and the node 108 and the gate thereof connected to the node 108. The node 108 comprises an output bias signal PRBP. The node 94 comprises an output bias signal PRBN.

In operation, when node 82 is low, transistor 92 is turned off and transistor 95 is turned on. Current therefore flows through transistor 95 and through transistor 100, transistor 100 being in a diode configuration. Transistor 104 is also connected in a diode configuration and, therefore, the PRBN signal will draw current through the source/drain path of transistor 95. This will cause transistor 106 to conduct and pull node 108 low, thus changing the voltage on the PRBP bias signal. Whenever the node 82 is high, transistor 92 is turned on, pulling node 94 low. This turns off both transistors 104 and 106 such that PRBN will be low and PRBP will be high.

Figure 5:
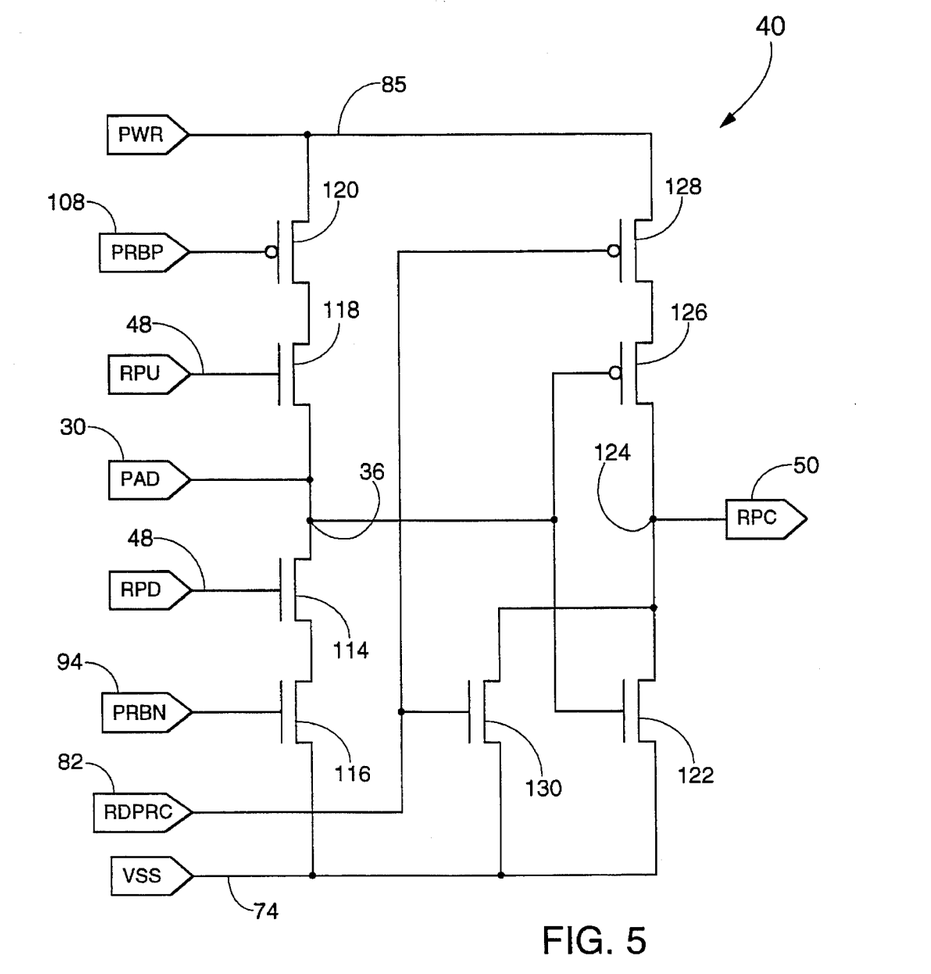
FIG. 5 illustrates a detailed diagram of the program buffer circuit for generating the program logic output signal.

Referring now to FIG. 5, there is illustrated a detailed schematic diagram of the program buffer 40. Two N-channel transistors 114 and 116 have the source/drain paths thereof connected in series and between node 36 and the $V_{ss}$ line 74. The gate of transistor 120 is connected to the PRBN signal on node 94, and the gate of transistor 114 is connected to the RPD input on line 48. An N-channel transistor 118 has the source/drain path thereof connected between the node 36 and one side of the source/drain path of a P-channel transistor 120. The gate of transistor 118 is connected to the RPU input signal on line 48. The other side of the source/drain path of the P-channel transistor 120 is connected to the power line 85, and the gate of transistor 120 is connected to the PRPB signal on node 108. The node 36 is connected to the gate of an N-channel transistor 122, the source/drain path thereof connected between a node 124 and the $V_{ss}$ rail 74. The node 124 comprises the output line 50 and is labelled RPC. Node 36 is also connected to the gate of a P-channel transistor 126, the source/drain path thereof connected between the node 124 and one side of the source/drain path of a P-channel transistor 128. The other side of the source/drain path of the P-channel transistor 128 is connected to the power rail 85 and the gate of transistor 128 is connected to the RDPRC signal on node 82. The RDPRC signal on node 82 is also connected to the gate of an N-channel transistor 130, the source/drain path thereof connected between the node 124 and the $V_{ss}$ rail 74.

In operation, whenever the RPU or RPD signals are present, the node 82 will be pulled low and RDPRC will be low. This is the read mode. In one mode, the presence of the pull down resistor is determined by raising the RPU signal high. In another mode, the presence of the pull up resistor is determined by pulling the RPD signal high. When the RPD signal is pulled high and there is no pull-up resistor connected, transistor 114 will be turned on, but transistor 118 will be turned off. If the pad 30 is floating meaning no pull-up or pull-down resistor connected, transistor 114 and transistor 116 will both conduct and therefore will pull node 36 down and turn transistor 126 on in the absence of a pull-up resistor. Since transistor 128 is already turned on due to the RDPRC signal being pulled low, node 124 will be pulled high, constituting a logic 1 state. Therefore, for either a floating state or the presence of the pull down resistor, there will be a logic 1 state on the output line 50. If the pull up resistor is present, node 36 will be pulled high by the pull-up resistor and transistor 126 will be pulled up and transistor 126 will be turned off pulling node 124 low, constituting a logic 0 state. Therefore, the presence of a pull up resistor results in the presence of a logic 0 state on the output line 50.

Whenever the RPU signal is generated on line 48, transistor 114 will be turned off and transistor 118 will be turned on. If the node 36 is floating, meaning it is not connected to a pull-up resistor or a pull-down resistor, transistor 118 will pull-up node 36, turning off transistor 126 and turning on transistor 122. This will pull node 124 low and output a logic 0 state on node 50. The logic 0 state will be present on node 54 under the presence of a pull up resistor or a floating state. However, in the presence of a pull down resistor, node 36 will be pulled low, turning transistor 126 on and turning transistor 122 off. This will result in the output of a logic 1 state on the output line 50. Therefore, the program buffer 40 can determine the presence of three states on the output 30 merely due to the presence of a resistor. Further, these resistors can be present even during the driving operation. However, the pads cannot be driven through a pull down transistor and the program state read at the same time.

Figure 6:
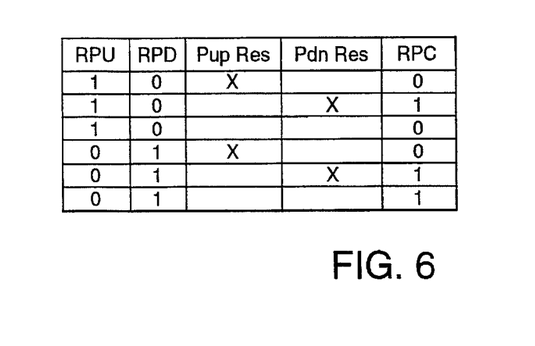
FIG. 6 illustrates a truth table for the programming function.

Referring now to FIG. 6, there is illustrated a truth table illustrating the logic state for the output line RPC in the presence of either the RPU signal being high or the RPD signal being high, and also as to what the state of the pad is, i.e., the presence of a pull up resistor, the presence of a pull down resistor, or a floating state. The presence of a pull up resistor or a pull down resistor is indicated by an X in the column, and when no X is present in either the column for the pull up resistor or the column for the pull down resistor, this indicates a floating state. Therefore, it can be seen that the presence of the RPU signal and a pull down resistor results in a logic 1 being output, whereas the presence of either a pull up resistor or a floating state results in the presence of a logic 0 output. Whenever RPD is high, a logic 0 will be output only when the pull up resistor is present, with a logic 1 being output when either the pull down resistor is present or a floating state is present. Therefore, the CPU 46 can ascertain what the logic state is merely by exercising each of the program buffers 40 with either the RPU signal or the RPD signal in two time periods and then reading the logic state output by the program buffer 40. This requires two cycles. For example, if the RPU signal were generated and the logic state were a logic 0, this would indicate either the presence of the pull up resistor or a floating state. By exercising the RPD signal, the logic 0 state would indicate the presence of a pull up resistor, and the logic 1 state would indicate the presence of a floating state, since the presence of a pull down resistor was eliminated when the RPU signal was exercised.

In summary, there has been provided an IC chip with programmable output drive/program pads. The output drive/program pads are programmed by either connecting a resistor from one of the output pads to a positive voltage rail or to a negative voltage rail, or by allowing the node to float. Therefore, a three state programming input is realized in a programming mode. The integrated circuit operates in a program read mode or in the drive mode. In the drive mode, the output drive/program pads are exercised to provide a driving signal. In the program read mode, the output circuitry is isolated by preventing current from flowing therethrough to the output pads. Current is then sunk from each of the pads to determine if the pull up resistor is present by monitoring the node and determining if the voltage on the node is pulled up. The presence of a floating state or a pull down resistor state will cause the node to be pulled low. The current is then sourced to the node to determine if a pull down resistor is present. If a pull down resistor is present, the node will be pulled low by the pull down resistor. When current is sourced to the node, a floating state or a pull up resistor will result in the node being pulled high. A CPU or microcontroller of the integrated circuit will be utilized to ascertain what the logic state is.

Although the preferred embodiment has been described in detail, it should be understood that various changes, substitutions and alterations can be made therein without departing from the spirit and scope of the invention as defined by the appended claims.

What is claimed is:

1. An integrated circuit with input/output pins for operating with multiple functions, comprising:

at least one multi-functional output pin for outputting control signals to an output load device having an associated impedance in a normal operating mode, and receiving program signals in a program mode;

an output programming device for selectively disposing a fixed program impedance with one side thereof connected directly to said multi-functional output pin and the other side thereof connected directly to an external voltage reference to provide a first program state, or no program impedance disposed directly between said multi-functional output pin and any reference voltage to provide a second program state;

a driver for driving said output pin in said normal operating mode;

an internal program buffer for continuously determining from the electrical characteristics of said multi-functional output pin in said program mode whether said program impedance is present on and connected directly to said multi-functional output pin or no program impedance is present on and connected directly to said multi-functional output pin, thus determining which of said first and second program states is present; and a controller for selecting said program mode or said normal operating mode, said controller in said program mode operable to read the output of said program buffer and, in said normal operating mode, to control said driver to control said output pin to generate said output control signals that are output to said device, said program impedance remaining directly connected to said multi-functional output pin while said driver is controlling said multi-functional output pin in said normal operating mode.

2. The integrated circuit of claim 1, wherein said output load device is activated in said normal operating mode when current is being sunk by said output pin with said driver being operable to sink current from said output pin and said output load device.

3. The integrated circuit of claim 1, wherein said output programming device is operable to dispose a first program impedance between said output pin and a negative voltage reference to provide a first programming state, a second program impedance between said output and a positive voltage reference to provide a second programming state or no program impedance between said output pin and any output reference to provide a third programming state, said first and second program impedances may be equal; and wherein said program buffer is operable in said program mode to determine whether said first program impedance or said second program impedance is present, or whether no program impedance is present by examining the electrical characteristics of said output pin, in order to determine whether said programming state is said first programming state, said second programming state or said third programming state.

4. The integrated circuit of claim 3, wherein said first and second program impedances are essentially identical.

5. The integrated circuit of claim 3, wherein said program buffer comprises:

a current source for sourcing current to said output pin;

a current sink for sinking current from said output pin;

said controller selecting said current source to determine if said first program impedance is present indicating that said second program impedance is not present and that said output pad is not associated with said third programming state, said controller operable to output a first signal indicating the presence of said first program impedance; and said controller selecting said current sink to determine if said second program impedance is present indicating that said first program impedance is not present and that said output pad is not associated with said third programming, said controller outputting a second signal indicating the presence of said second program impedance;

the absence of said first and second signals indicating that said output pad is in said third programming state with no impedance disposed between said output pin and any reference voltage during said program mode.

6. The integrated circuit of claim 1, and further comprising a disabling device operating in said program mode to disable said output load device such that said output load device does not present any impedance between said output pin and any reference voltage during said program mode, and said disabling device operable in said normal operating mode to allow said output load device to be connected to a reference voltage such that an impedance is present on said output pad for driving by said driver for driving said output pin in said normal operating mode.

7. The integrated circuit of claim 1, and further comprising a register for storing the output of said program buffer, said register operable to be read by said controller.

8. A method for programming an integrated circuit for an output pin, comprising the steps of:

switching the mode of operation between a program mode and an normal operating mode, such that the integrated circuit may remain in either mode for an extended period of time;

in the normal operating mode:

driving an output load device having an associated impedance connected to the output pin to activate the output load device;

in the program mode:

disabling the step of driving, continuously determining from the electrical characteristics on the multi-functional output pin if a program impedance is disposed directly between the output pin and an external voltage with one side of the program impedance connected directly to the output pin and the other side thereof connected directly to the external voltage, the presence of the program impedance indicating a first program state and the absence of the program impedance indicating a second program state, generating a first signal if the program impedance is present on the output pin, generating a second signal if the program impedance is not present on the output pin, and reading the first and second signal to determine the programming input during the program mode.

9. The method of claim 8, wherein in the normal operating mode the step of driving comprises sinking current from the output pin, wherein the output load device is connected to a positive voltage such that current flows through the output load device during the normal operating mode when driven by the step of driving.

10. The method of claim 8, wherein the step of continuously determining if the program impedance is disposed between the output pin and an external voltage comprises:

continuously determining if the program impedance is disposed between the output pin and a positive voltage by examining the electrical characteristics of the output pin;

continuously determining if the program impedance is disposed between the output pin and a negative voltage by examining the electrical characteristics of the output pin;

continuously determining if no program impedance is present during the program mode by examining the electrical characteristics of the output pin;

the presence of the program impedance disposed between the output pin and a positive voltage indicating a first program state, the presence of the program impedance disposed between the output pin and a negative voltage indicating a second program state and the absence of any program impedance indicating a third program state;

the step of generating the first signal comprising generating a first signal if the program impedance disposed between the output pin and a positive voltage is determined to be present and generating a third program state if the program impedance is determined to be disposed between the output pin and a negative voltage is present; and the step of reading operable to also read the third signal to determine the programming input during the program mode.

11. The method of claim 10, wherein the program impedance that is determined to be disposed between the output pin and the positive and negative reference voltages, respectively, are substantially identical.

12. The method of claim 10, wherein the steps of continuously determining comprises:

sourcing current to the output pin during a first time period;

sinking current from the output pad during a second time period;

monitoring the voltage on the output pad during first and second time periods;

outputting a first program signal when the voltage on the output pin goes lower than a nominal voltage during the current sourcing operation, indicating the presence of the second impedance and a second program signal when the voltage on the output pin goes higher than the nominal voltage, indicating the presence of no impedance or of the first impedance;

outputting a third program signal during the current sink operation when the voltage on the output pin goes higher than the nominal voltage, indicating the presence of the first impedance and outputting a fourth program signal when the voltage on the output pin goes lower than the nominal voltage, indicating the presence of the second program impedance or no program impedance; and processing the first, second, third and fourth output program signals to determine whether the first, second or third program states is present, with the first program state present when the first program signal is generated, the second program state is present when the third program signal is generated and the third program state is present when the second program signal is generated during the first time period and the fourth program signal is generated during the second time period.

13. The method of claim 8, and further comprising disabling the output load device during the program mode so that no impedance is presented to the output pin during the program mode by the output load device.

14. The method of claim 8, and further comprising storing the first or second signals in a register.

* * * * *

UNITED STATES PATENT AND TRADEMARK OFFICE
CERTIFICATE OF CORRECTION

PATENT NO. : 5,477,166
DATED : December 19, 1995
INVENTOR(S) : Wallace E. Matthews It is certified that error appears in the above-identified patent and that said Letters Patent is hereby corrected as shown below:

In the Title:

Replace "PROGRAMMABLE OUTPUT DEVICE WITH INTEGRATED CIRCUIT" with --MULTI-FUNCTIONAL PROGRAMMABLE OUTPUT PIN FOR INTEGRATED CIRCUIT WITH IMPEDANCE PROGRAMMING CAPABILITY--.

In the Specification:

Column 3, line 36, replace "program.!" with --program--.

Signed and Sealed this

Twenty-eighth Day of May, 1996

*Attest:*

BRUCE LEHMAN

*Attesting Officer*     *Commissioner of Patents and Trademarks*